US010609505B1

(12) United States Patent
Pires et al.

(10) Patent No.: US 10,609,505 B1
(45) Date of Patent: Mar. 31, 2020

(54) METHOD AND APPARATUS FOR AUTOMATED TUNING OF VEHICLE SOUND SYSTEM

(71) Applicant: Stillwater Designs and Audio, Inc., Stillwater, OK (US)

(72) Inventors: Fernando Eid Pires, Stillwater, OK (US); Joe H. Hobart, Stillwater, OK (US)

(73) Assignee: Stillwater Designs and Audio, Inc., Stillwater, OK (US)

( * ) Notice: Subject to any disclaimer, the term of this patent is extended or adjusted under 35 U.S.C. 154(b) by 0 days.

(21) Appl. No.: 16/231,833

(22) Filed: Dec. 24, 2018

Related U.S. Application Data

(60) Provisional application No. 62/614,382, filed on Jan. 6, 2018.

(51) Int. Cl.

| | |
|---|---|
| ***H03G 1/02*** | (2006.01) |
| ***H04S 7/00*** | (2006.01) |
| ***H03G 3/00*** | (2006.01) |
| ***H04R 3/00*** | (2006.01) |
| ***H04R 3/12*** | (2006.01) |
| ***H04R 1/40*** | (2006.01) |

(52) U.S. Cl.
CPC ............. *H04S 7/307* (2013.01); *H04R 1/403* (2013.01); *H04R 3/12* (2013.01); *H04R 2499/13* (2013.01)

(58) Field of Classification Search
CPC . H04R 1/403; H04R 3/12; H04R 3/14; H04R 2499/13; H04S 7/307; H03G 3/002; H03G 3/00; H03G 1/02
USPC ........................................ 381/303, 120, 109
See application file for complete search history.

(56) References Cited

U.S. PATENT DOCUMENTS

| | | | | |
|---|---|---|---|---|
| 4,320,255 | A * | 3/1982 | Null ........................ | H03G 1/02 381/109 |
| D305,333 | S | 1/1990 | Irby | |
| D307,015 | S | 4/1990 | Irby | |
| D355,193 | S | 2/1995 | Irby | |
| D449,293 | S | 10/2001 | Irby et al. | |
| D456,386 | S | 4/2002 | Irby et al. | |
| D473,216 | S | 4/2003 | Irby et al. | |
| 6,611,604 | B1 | 8/2003 | Irby et al. | |
| 6,731,773 | B1 | 5/2004 | Bergbower et al. | |
| 6,968,069 | B1 | 11/2005 | Zhao | |
| 7,916,890 | B2 | 3/2011 | Irby et al. | |

(Continued)

FOREIGN PATENT DOCUMENTS

| | | |
|---|---|---|
| AU | 773216 B2 | 9/2004 |
| AU | 2004205159 | 8/2006 |

(Continued)

*Primary Examiner* — Paul Kim
*Assistant Examiner* — Ubachukwu A Odunukwe
(74) *Attorney, Agent, or Firm* — Mary M. Lee

(57) ABSTRACT

An Auto Setup Program ("ASP") may be implemented in the sound system of a vehicle to accomplish the goal of a dramatically improved audio quality achievable in any vehicle, regardless of the speaker components and head-unit utilized. The ASP performs automated time alignment measurements and equalizer processes using an external microphone. The ASP eliminates the need for expensive and time consuming professional tuning operations. The on-board ASP can be run multiple times as desired. For example, the ASP can be executed after changes to the system, such as upgrading speakers.

21 Claims, 9 Drawing Sheets

(56) References Cited

U.S. PATENT DOCUMENTS

| | | | | |
|---|---|---|---|---|
| 8,023,688 | B2 | 9/2011 | Irby et al. | |
| D783,577 | S | 4/2017 | Ambrose et al. | |
| D798,837 | S | 10/2017 | Surratt et al. | |
| D807,326 | S | 1/2018 | Justis | |
| D820,815 | S | 6/2018 | Justis | |
| 2003/0194104 | A1 | 10/2003 | Irby et al. | |
| 2008/0075318 | A1 | 3/2008 | Zhao | |
| 2008/0118098 | A1 | 5/2008 | Irby et al. | |
| 2011/0142262 | A1 * | 6/2011 | Sunaga | H04S 7/308 381/120 |
| 2019/0028076 | A1 * | 1/2019 | Takahashi | H03G 3/002 |
| 2019/0128935 | A1 * | 5/2019 | Gautama | G01R 27/16 |

FOREIGN PATENT DOCUMENTS

| | | | | |
|---|---|---|---|---|
| CA | 2387939 | | 9/2006 | |
| CN | 101257733 | | 8/2012 | |
| EP | 1222839 | | 7/2012 | |
| ID | 018046 | | 9/2006 | |
| JP | 2009027631 | * | 2/2009 | H04R 3/00 |
| KR | 554818 | | 2/2006 | |
| MX | 227315 | | 4/2005 | |
| MY | 125083 | | 7/2006 | |
| SG | 87643 | | 5/2005 | |
| TH | 048559 | | 3/2016 | |
| TW | 498700 | | 12/2002 | |
| WO | 0131975 | A2 | 5/2001 | |

* cited by examiner

METHOD AND APPARATUS FOR AUTOMATED TUNING OF VEHICLE SOUND SYSTEM

CROSS-REFERENCE TO RELATED APPLICATIONS

This application claims the benefit of U.S. provisional application No. 62/614,382 entitled "Method and Apparatus for Automated Tuning of Vehicle Sound System," filed Jan. 6, 2018, the contents of which are incorporated herein by reference.

FIELD OF THE INVENTION

The present invention relates to sound systems generally and, more particularly but without limitation, to tuning of sound systems in vehicles.

BRIEF DESCRIPTION OF THE DRAWINGS

The accompanying drawings, which are incorporated into and form a part of the specification, illustrate one or more embodiments of the present invention and, together with this description, serve to explain the principles of the invention. The drawings merely illustrate a preferred embodiment of the invention and are not to be construed as limiting the scope of the invention.

DETAILED DESCRIPTION OF THE PREFERRED EMBODIMENT(S)

A sound system in a vehicle typically includes a head unit or receiver capable of receiving multiple different sound sources, such as radio, CD player, and the like. Also typically included are an amplifier and several speakers, and the speakers typically will have different frequency ranges. By way of example, the speakers may include a combination of tweeters, woofers, mid-range speakers, coaxial speakers, and a subwoofer. Still further, some sound systems include an equalizer and a crossover.

Optimum enjoyment of a good vehicle sound system depends on accurate tuning. However, a professional tuning is expensive, perhaps even more expensive than the system itself. It requires a professional skilled in the tuning process and the use of expensive equipment, such as a real-time-analyzer or "RTA." Moreover, when one of the components is upgraded or changed, the system should be retuned, requiring another expensive and time-consuming trip to the dealer or installer.

The present invention provides a system and method for automated tuning of a vehicle sound system that may be implemented in a digital signal processor (DSP) and a microphone. The DSP, which may be incorporated in an amplifier unit, is configured to provide automated, professional-quality tuning using feedback from the microphone. Processing performed by the DSP may include, without limitation, equalization, sensitivity matching, crossover filtering, gain balance, brightness correction, and time-arrival correction or "time delay" correction. The inventive system provides dramatically improved audio quality in any car audio system regardless of the number or type of speaker components or the head unit utilized. Additionally, the turning process can be repeated whenever necessary. These and other features and advantages of the present invention will become apparent from the following description with reference to the accompanying drawings.

Figure 1A:
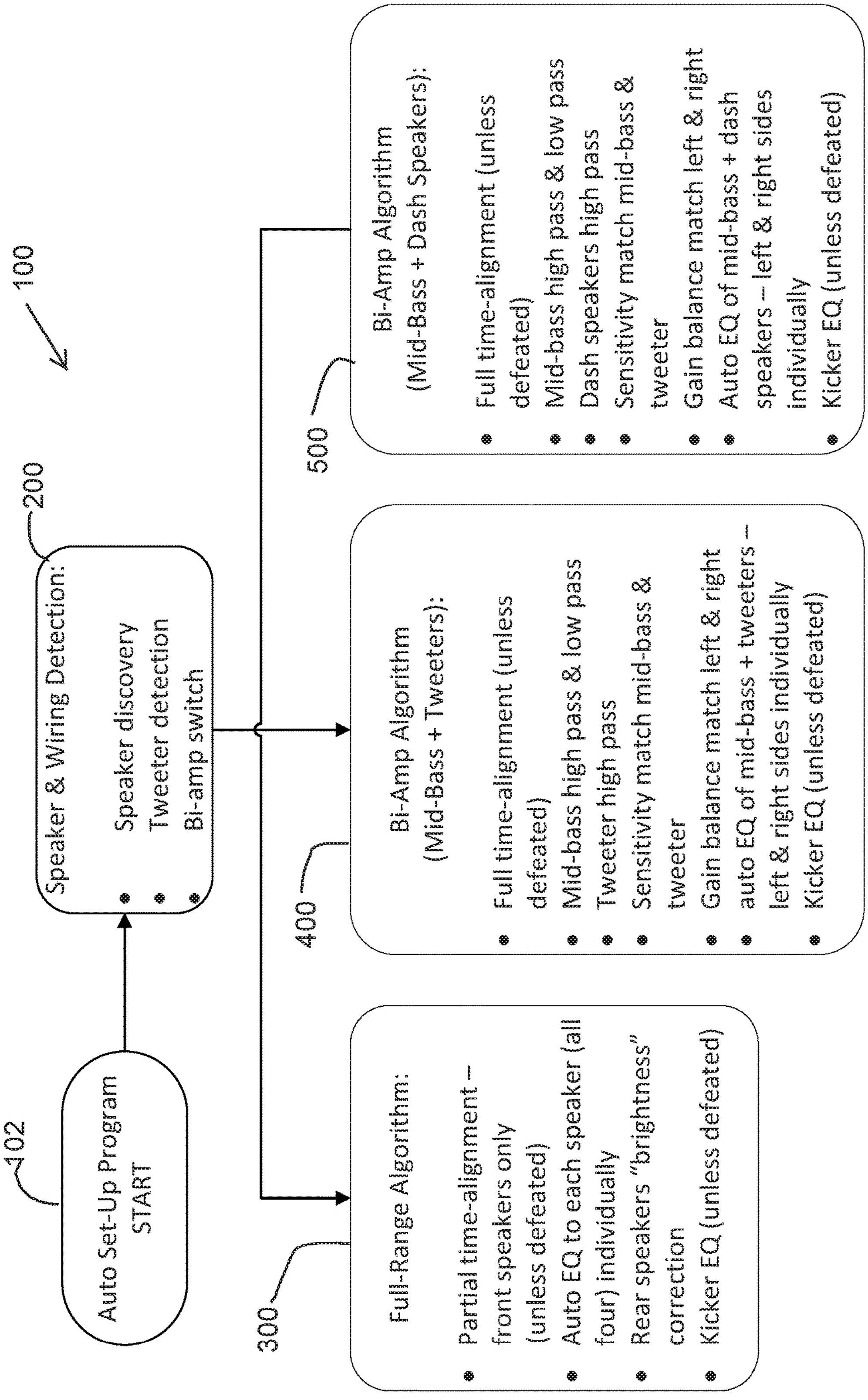
FIG. 1A is functional block diagram of the main steps of a preferred embodiment of an automated tuning system in accordance with the present invention.

Turning now to the drawings in general and to FIG. 1A in particular, there is shown therein a block diagram depicting an overview of the automated tuning method of the present invention designated generally by the reference number 100. The Auto Setup Program or "ASP" commences at START 101. At 200 a speaker and wiring detection procedure first is performed. After confirming sufficiently low ambient noise, the system conducts a frequency sweep to determine the presence of a tweeter.

Next, depending on the position of the bi-amplification switch, the program proceeds through three alternative tuning operations. If there is no tweeter and the bi-amp switch is OFF, the system proceeds to the "Full Range" Algorithm 300. If there is a tweeter and the bi-amplification switch is ON, the system proceeds to the "Bi-amp MidBass+Tweeters" Algorithm 400. If there is no tweeter and the bi-amp switch is ON, the system proceeds to the "Bi-amp MidBass+ Dash Speakers" Algorithm 500. If there is a tweeter and the bi-amplification switch is OFF, the system outputs an error code.

Figure 1B:
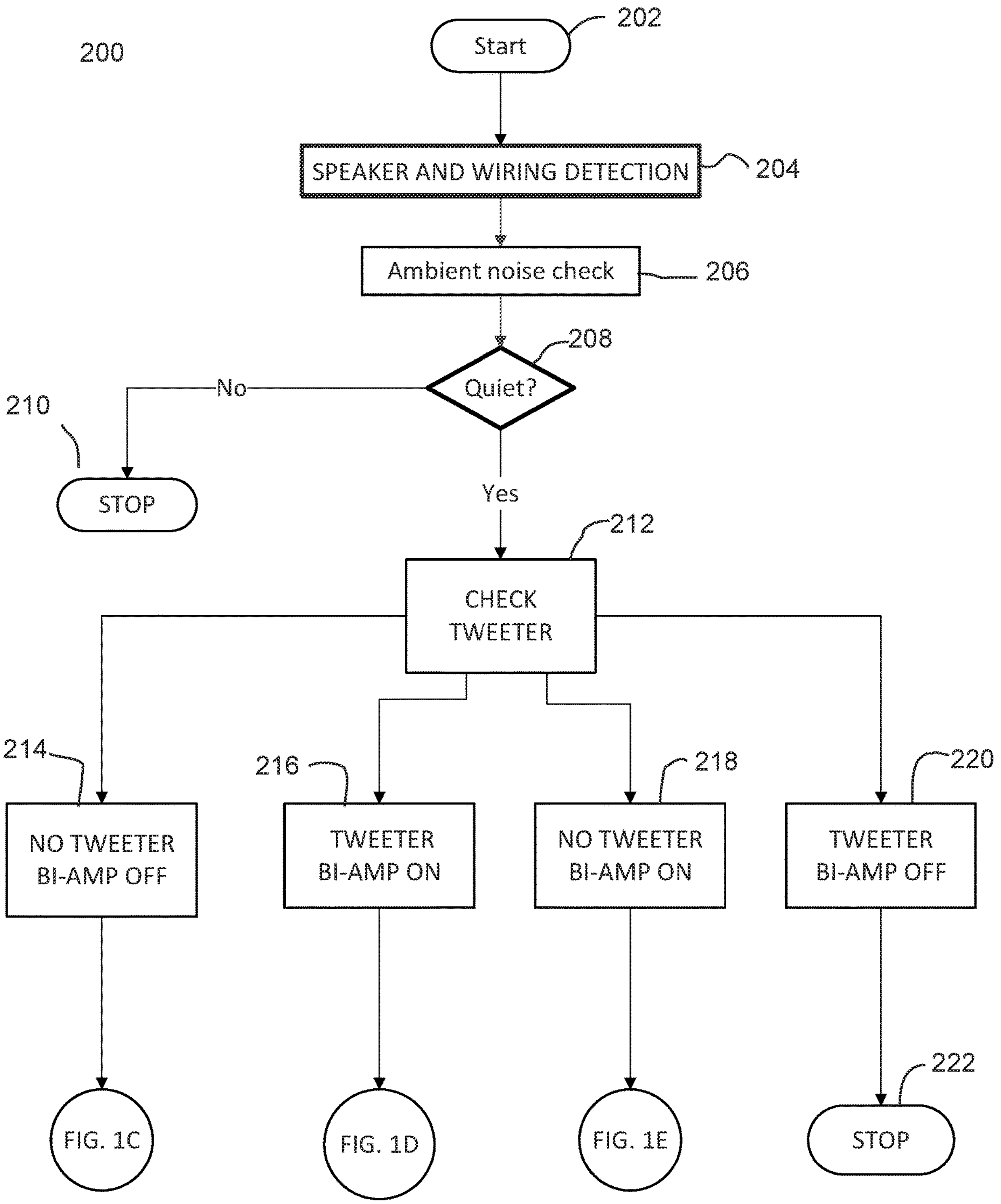
FIG. 1B is a functional flow diagram illustrating the logic carried out by the Speaker and Wiring Detection Protocol of the inventive system.

Referring now to FIG. 1B, the speaker and wiring detection process will be explained. The process commences at START 202 by initiating the Speaker and Wiring Detection procedure 204. First, an ambient noise check is conducted at 206. The ASP will listen and only proceed in case the ambient noise is quiet enough at 208. This step ensures the reliability and repeatability of the results. If excessive ambient noise is detected, the process is halted at 210.

Next, a "hot wired" tweeter check may be performed at 212. Because the ASP allows for "Bi Amplification" (Active Crossover setup), as described hereafter, there will be cases in which tweeters will be wired directly to the amplifier without any passive crossover. A sweep between a higher and a lower frequency is performed, if the response at the lower frequency is dramatically lower compared to the response at the higher frequency, then a tweeter is present. Otherwise, a speaker is present. There are four (4) possible conditions: (1) a tweeter is not present and the Bi-Amp switch is OFF; (2) a tweeter is present and the Bi-Amp switch is ON; (3) a tweeter is not present and the Bi-Amp switch is ON; and, (4) a tweeter is present and the Bi-Amp switch is OFF.

Figure 1C:
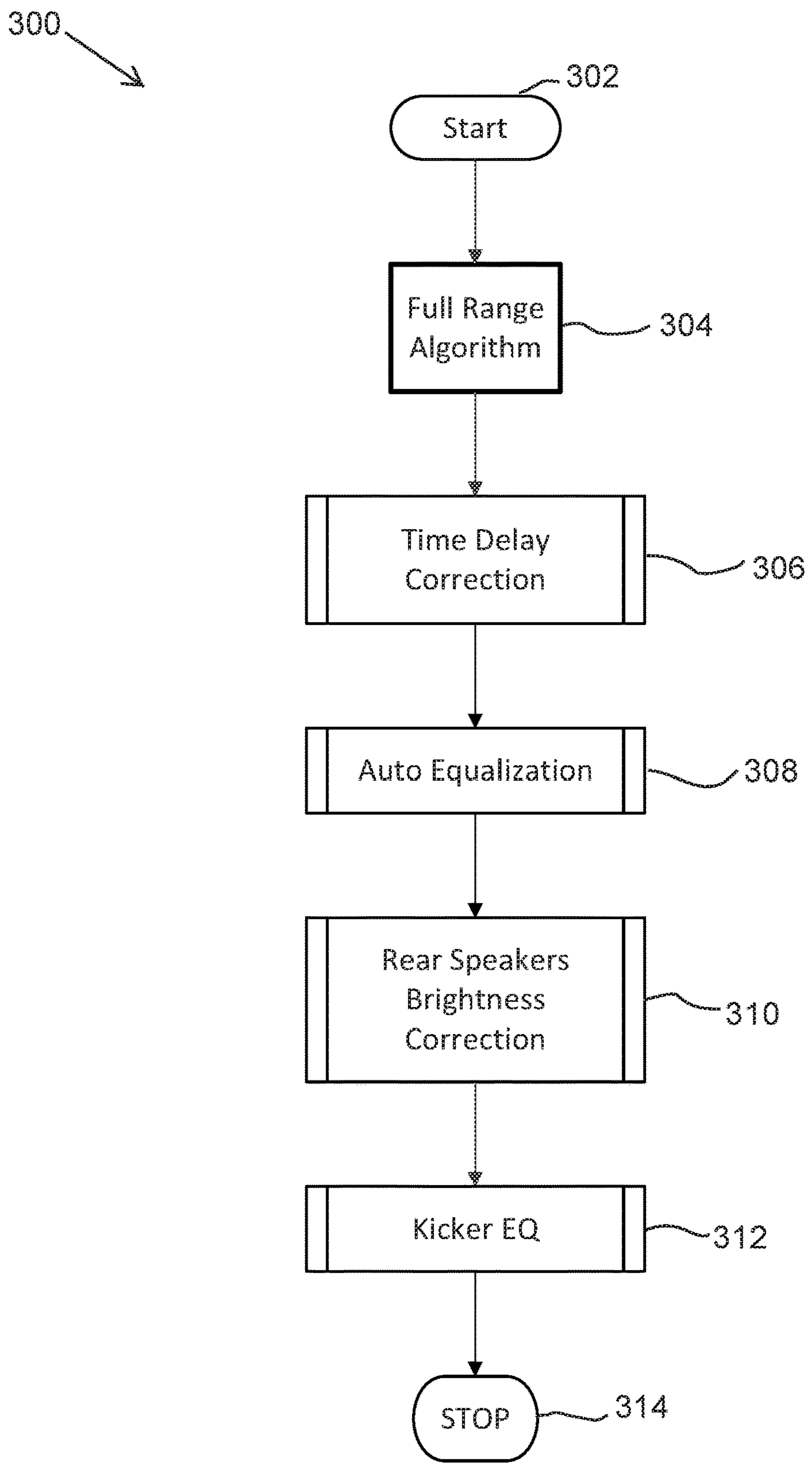
FIG. 1C is a functional flow diagram illustrating the logic carried out by the Full Range Algorithm of the inventive system.

If the first condition is present, that is, if a tweeter is not present and the Bi-Amp switch is OFF, then at 212 ASP progresses to the Full Range Algorithm 300 at 214 illustrated in FIG. 1C. This is the algorithm that will be used the most, as it will be adequate for most cars. Preferably, it includes four steps.

Figure 1D:
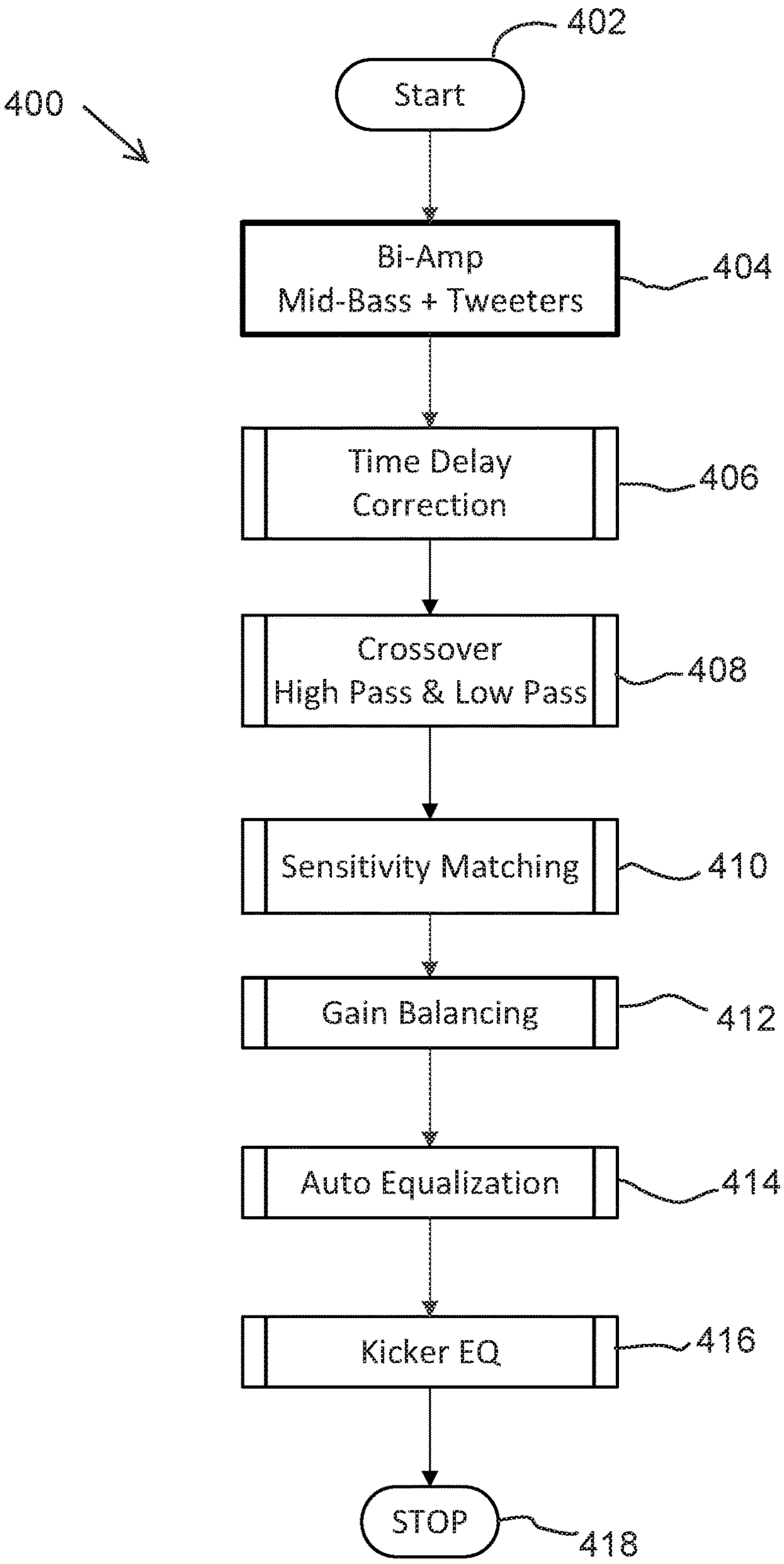
FIG. 1D is a functional flow diagram illustrating the logic carried out by the Bi-Amp Mid-Bass and Tweeters Algorithm of the inventive system.

If the second condition is present, that is, a tweeter is present and the Bi-Amp switch is ON, then at 212 the ASP moves forward with the Bi-AMP Mid-bass+Tweeters Algorithm 400 at 216 illustrated in FIG. 1D. This algorithm is targeted to more enthusiastic users that want to obtain the maximum sound quality from their audio system and is specifically designed for a "Front Stage Only" configuration, with no speakers in the rear part of the vehicle.

Figure 1E:
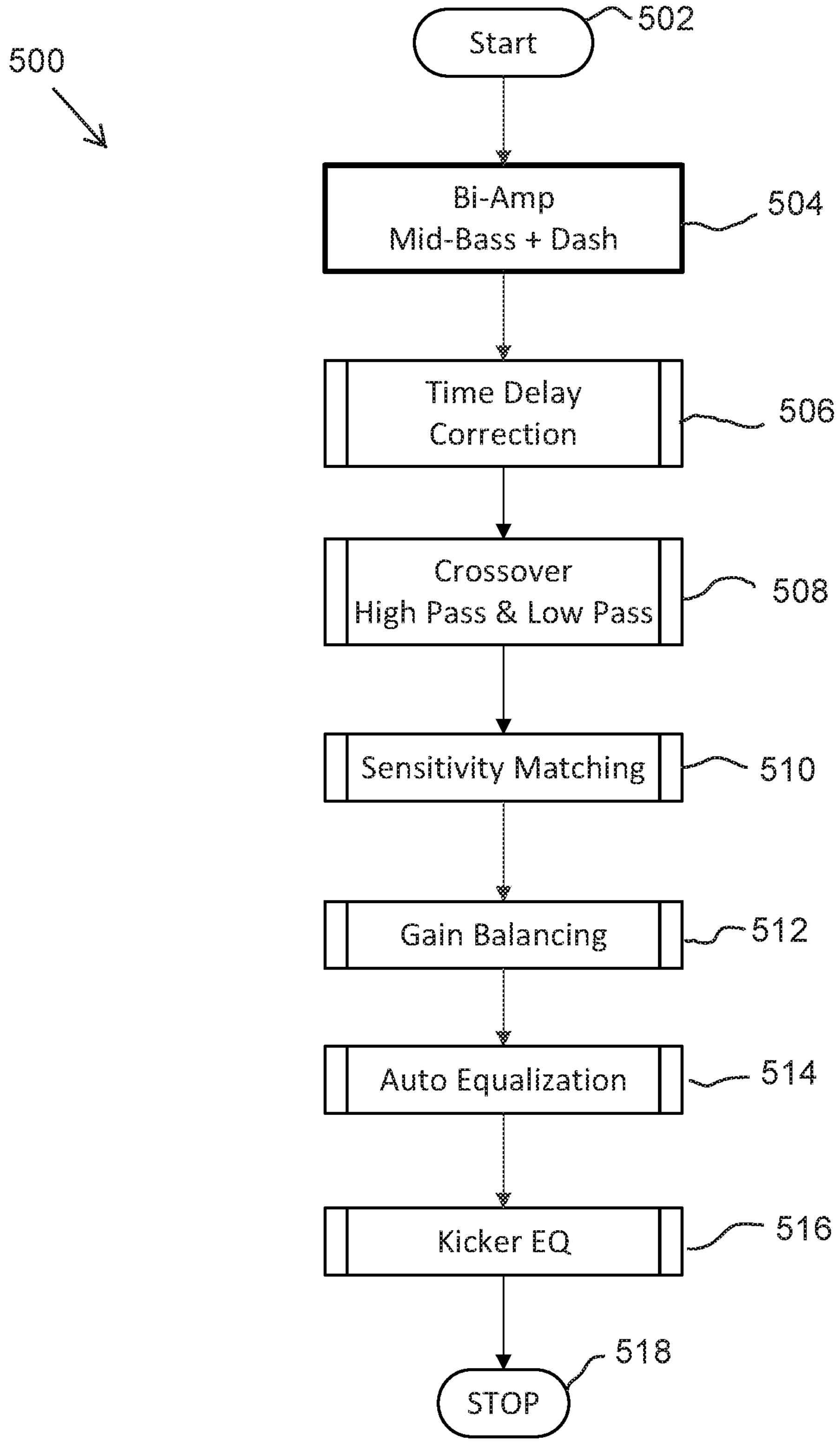
FIG. 1E is a functional flow diagram illustrating the logic carried out by the Bi-Amp Mid-Bass and Dash Speakers Algorithm of the inventive system.

If the third condition is present, that is, in case a tweeter is NOT present and the Bi-Amp switch is ON, then at 212 the ASP moves forward with the Bi-Amp Mid-bass+Dash Speakers Algorithm 500 at 218 illustrated in FIG. 1E. The "Mid-bass+Dash Speakers" process may comprise the same seven steps as described above for the "Mid-bass+Tweeters" procedure 400. The only difference is the crossover points, the latter being adequate for a combination of door woofers and dash speakers, while the former is adequate for a combination of door woofers and tweeters.

If the fourth condition is present, that is, a tweeter is present and the Bi-AMP switch is OFF, the ASP at 220 does not move forward and stops process at 222. The unit may beep "n" times to communicate the error code "Tweeter found but Bi-Amp switch is OFF." This "exit" action prevents the tweeter from being damaged by receiving electrical signals that would only be appropriate for a speaker (low frequencies present).

The Full Range Algorithm 300 will be explained with reference to FIG. 1C. At START 302, the Full Range the Algorithm 304 is commenced with a time delay correction protocol 306 that is run on the front speakers. The ASP measures the distance of both front speakers to the microphone, as described more fully below, which is placed at the main listener's position (usually headrest). DSP Time Delay will be applied to the speaker that is closer to the microphone so that the sound of both front speakers will reach the listener at the same time, improving soundstage focus and phase.

Next, at 308 Auto Equalization is performed separately on each speaker in the system, including all speakers in the front and rear. The result is a flatter frequency response at the main listener position, thus "EQ steering" is obtained.

Next, at 310, in order to prevent the rear speakers from pulling the front soundstage, a "Brightness correction" is applied to the rear speakers. This may include attenuating their frequency response at medium and higher frequencies.

Finally, at 312 the Kicker® Signature EQ equalizer process is applied for the newly tuned system, delivering the characteristic "Kicker Sound." "Kicker" is a trademark owned by Stillwater Designs and Audio, Inc., (Stillwater, Okla.). The amplifier unit may include a switch for defeating the Kicker EQ equalizer procedure.

Turning now to FIG. 1D, the Bi-AMP Mid-bass+Tweeters Algorithm 400 will be described. This is performed if the second condition is detected in the tweeter check protocol 210 in the initial Speaker & Wiring Detection process 200 (FIG. 1A). That is, a tweeter is present and the Bi-Amp switch is ON.

First, at START 402, the Bi-AMP Mid-bass+Tweeters Algorithm is commenced at 404, and a Full Time Delay correction is performed 406. As explained below, a microphone is placed at the main listener's position, such as the driver's headrest, and the ASP measures the distance from the microphone to all system speakers, assuming they are all found in the front part of the vehicle (front doors, dash, A-pillars, etc.). DSP Time Delay will be applied inversely to each speaker in order to counter-act the existing time delay of the physical system created by the uneven distances that the speakers are from the microphone. In this way, the sound of all speakers will reach the listener at the same time, improving soundstage focus and phase. Because this approach utilizes all channels, the focus should be sharper compared to the time delay of the "Full Range" algorithm. The amplifier unit may include a switch for deactivating the time delay correction protocol, at the user's option.

Next, at 408 a crossover application is conducted. Low Pass is applied to the mid-bass speakers (located on the doors) and high pass is applied to the tweeters. The tweeters will reproduce the higher frequencies, whereas the door speakers will reproduce the lower frequencies. Consequently, the soundstage is raised, as the tweeters are usually located on an upper location, such as A-pillars or dash.

In sensitivity matching at 410, the ASP will play pink noise separately through the door speakers and the tweeters. Then, it will compare "how loud" these are. Once these values are registered, the ASP will apply attenuation to the louder set. This step improves sound quality. For example, usually tweeters are much more sensitive (louder) than the door speakers, so it is necessary to attenuate the signal to the tweeters. In this way, they can play music at the same perceived "loudness" level as the door speakers. Otherwise, the tweeters are louder and the sound system may be perceived as "harsh sounding."

In Gain Balance at 412, the ASP will play pink noise separately through all left and right sets of transducers (speakers and tweeters) once the crossover 408 and sensitivity matching 410 is complete. The set of transducers closer to the main listener position (usually the driver's side) will naturally appear to be louder, thus a proportional amount of attenuation will be applied in order to make this set of transducers to be perceived as the same loudness level as the set of transducers on the opposite side (usually the passenger side), thus, centering the soundstage.

Auto equalization is performed at 414 on each set of transducers separately (left and right), with the crossover 408, sensitivity matching 410, and gain balance 412 in place. Usually this includes performing the auto equalization on the door speakers and tweeters altogether. This will consequently correct and improve any dips or peaks on the frequency response of the transducer-set caused by combining two or more transducers that are in different locations.

Finally, at 416 the Kicker® Signature EQ equalizer process is applied for the newly tuned system, delivering the characteristic "Kicker Sound."

Turning now to FIG. 1E, the Bi-AMP Mid-bass+Dash Speakers Algorithm 500 will be described. This is performed if the second condition is detected in the tweeter check protocol 210 in the initial Speaker & Wiring Detection process 200 (FIG. 1A). That is, no tweeter is detected is present and the Bi-Amp switch is ON.

At START 502, the Bi-AMP Mid-bass+Dash Speakers Algorithm 500 is commenced at 504, and again the step is a full time delay correction at 506. A microphone is placed at the main listener's position, such as the driver's headrest, and the ASP measures the distance from the microphone to all system speakers, assuming they are all found in the front part of the vehicle (front doors, dash, A-pillars, etc.). DSP time delay will be applied inversely to each speaker in order to counteract the existing time delay of the physical system created by the uneven distances that the speakers are from the microphone. In this way, the sound of all speakers will reach the listener at the same time, improving soundstage focus and phase. Because this approach utilizes all channels, the focus should be sharper compared to the time delay of the full range algorithm.

Next, at 508 a crossover application is performed. Low pass is applied to the mid-bass speakers (located on the doors), and high pass is applied to the dash speakers. The dash speakers will reproduce the higher frequencies, whereas the door speakers will reproduce the lower frequencies. Consequently, the soundstage is raised, as the dash speakers are usually located on an upper location, such as A-pillars or dash.

In sensitivity matching 510, the ASP will play pink noise separately through the door speakers and the dash speakers. Then, it will compare "how loud" these are. Once these values are registered, the ASP will apply attenuation to the louder set. This step improves sound quality.

In gain balance at 512, the ASAP will play pink noise separately through all left and right sets of transducers (speakers and dash speakers) once the crossover and sensitivity matching is in place. The set of transducers closer to the main listener position (usually the driver's side) will naturally appear to be louder, thus a proportional amount of attenuation will be applied in order to make this set of transducers to be perceived as the same loudness level as the set of transducers on the opposite side (usually the passenger side), thus, centering the soundstage.

Next, at 514 auto equalization is performed on each set of transducers separately (left and right), with the crossover, sensitivity matching, and gain balance in place. Usually this includes performing the auto equalization on the door speakers and dash speakers altogether. This will consequently correct and improve any dips or peaks on the frequency response of the transducer-set caused by combining two or more transducers that are in different locations.

Finally, at 516 the Kicker® Signature EQ equalizer process is applied for the newly tuned system, delivering the characteristic "Kicker Sound."

The DSP Time Delay Correction protocol may have two steps. First, the distance between two speakers and a microphone is measured. Second, the time for the signal to travel to the closest speaker is extended to match the time it takes the signal to reach the furthest speaker.

Figure 2:
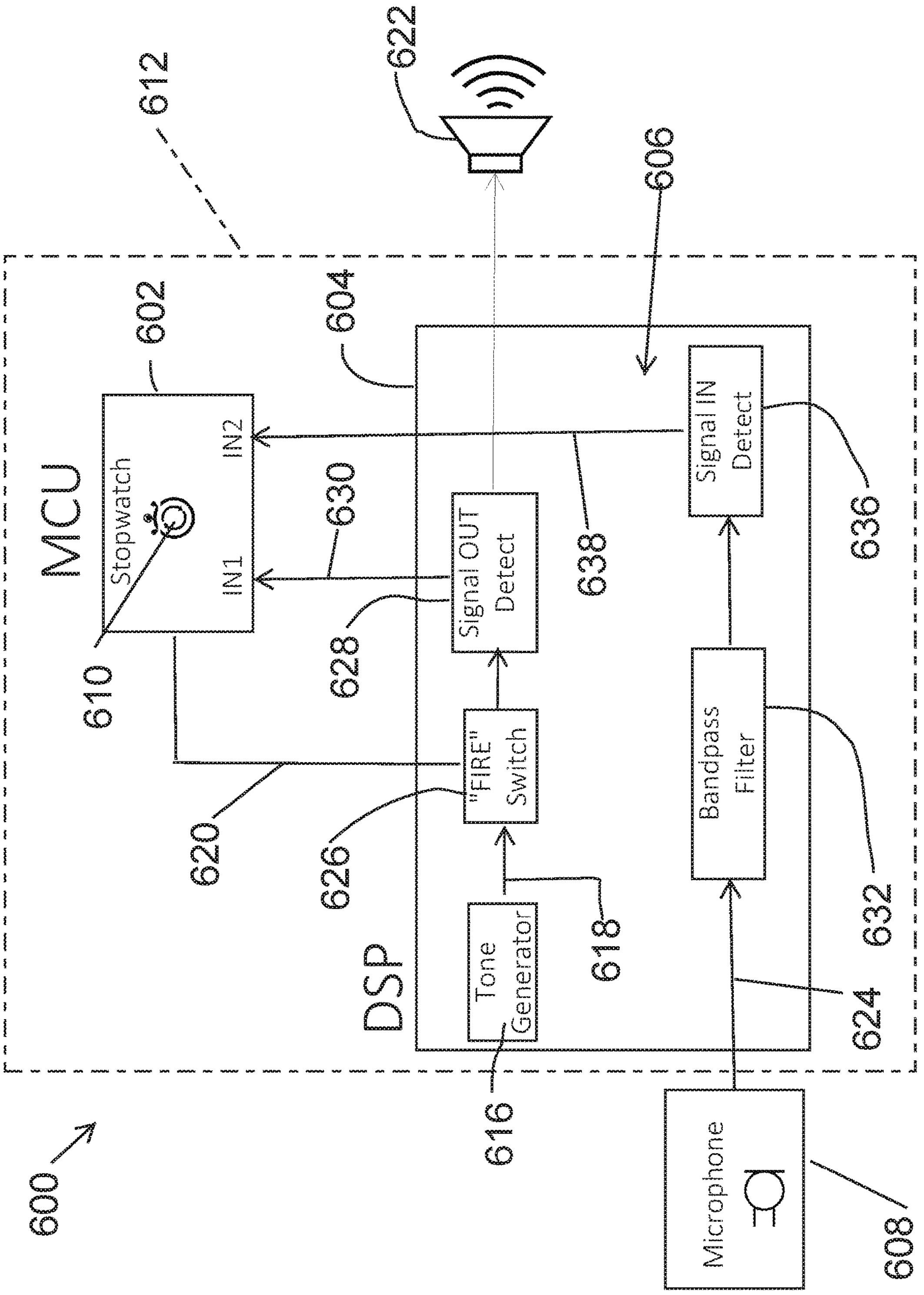
FIG. 2 is a block diagram of the time delay correction circuit.

One embodiment of a system configured to carry out the auto set-up program is depicted in the block diagram of FIG. 2 and designated generally by the reference number 600. The system 600 includes a micro-controller (MCU) 602 and a DSP 604. The DSP may include a time delay measurement circuit, and an exemplary circuit is designated generally at 606. The components of time delay measurement circuit 606 work in conjunction with an external microphone 608 and a timer, such as a stopwatch 610, in the MCU 602. The DSP 604 and MCU 602 may be incorporated in an amplifier 612.

The exemplary time delay measurement circuit 606 comprises a tone generator 616 that generates a signal 618 that can be reproduced by the target speaker 622 and heard back by the ASP 600 as a signal 624 from the microphone 608. In response to input from the MCU 602 at 620 a trigger "fire switch" 626 outputs the tone signal 618 from the tone generator 616 to a "Signal OUT Detect" block 628. The "Signal OUT Detect" block 628 notifies the MCU 602 at 630 once the tone signal exits the DSP 604, and this activates the stop-watch 610 to begin counting the time in units of "DSP audio frames."

A bandpass filter 632 is centered at the same frequency as the tone generator 616, with a very narrow bandwidth. It functions as a filter that will let only the generated tone get through it and block any other noise. In this way, the measurement is more reliable. A "Signal IN Detect" block 636 notifies the ASP at 638 once the tone signal is received in the DSP 604 through the microphone 608. This will cause the stop-watch 610 in the MCU 602 to stop counting the time. This time delay measurement is carried out for each of the target speakers, such as the speakers 622*a* and 622*b* in FIG. 3.

Figure 3:
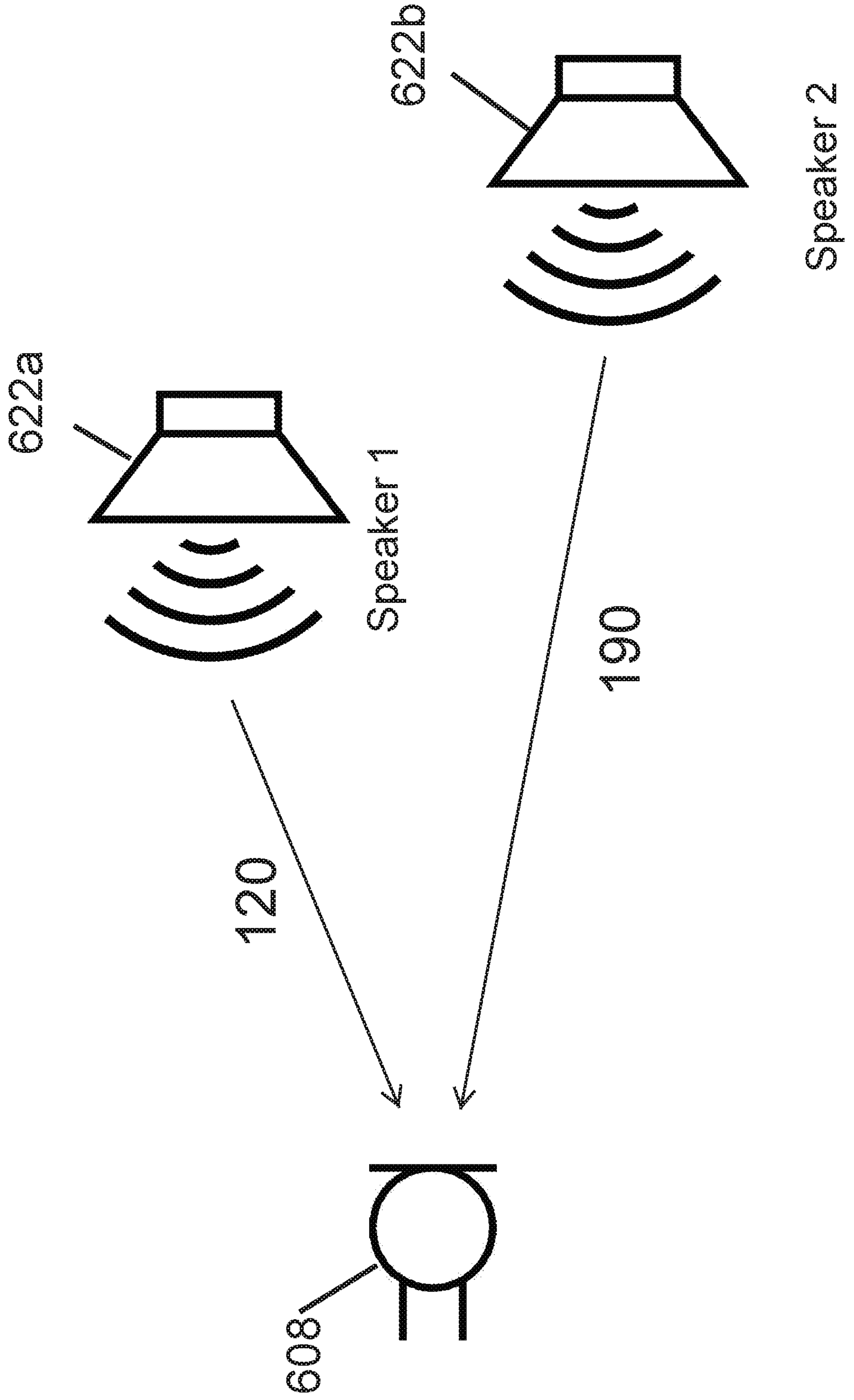
FIG. 3 is a schematic illustration of the time delay protocol between two speakers at different distances from the system's microphone.

The Time Delay Measurement circuit 606 allows to the MCU 602 accurately to count how long a tone signal takes to travel from each target speaker 622 to the microphone 608. In the example illustrated in FIG. 3, the time for the signal to travel from the speaker 622*a*, closest to the microphone 608 is 120 units, while the time for the signal to travel from the speaker 622*b*, furthest from the microphone is 90 units. By taking this time measurement in units of "DSP audio frames," it allows the time-difference found between the speakers 622*a* and 622*b* (FIG. 3) to be inversely applied as a "DSP Delay" to the system. This nullifies the uneven arrival time between speakers caused by the variety of distances found on the physical system. As illustrated in FIG. 3, the extra time for the signal to travel to the second speaker 622*b* as compared to the first speaker 622*a* is applied to the first speaker so that both speakers receive the signal simultaneously.

Figure 4A:
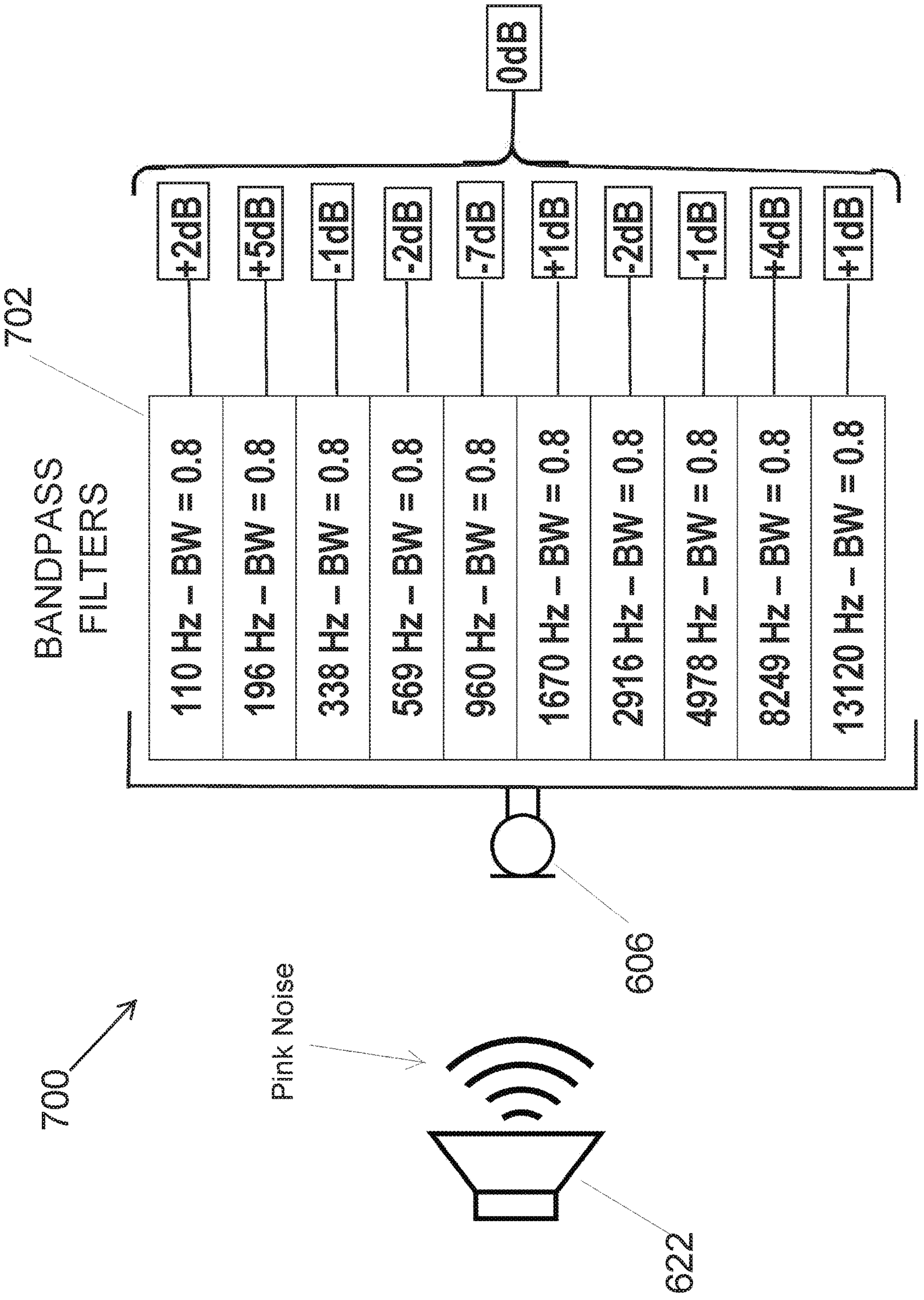
FIGS. 4A and 4B depict the auto equalization function of the automated setup system as applied to an exemplary equalizer with ten (10) bandpass filters.
Figure 4B:
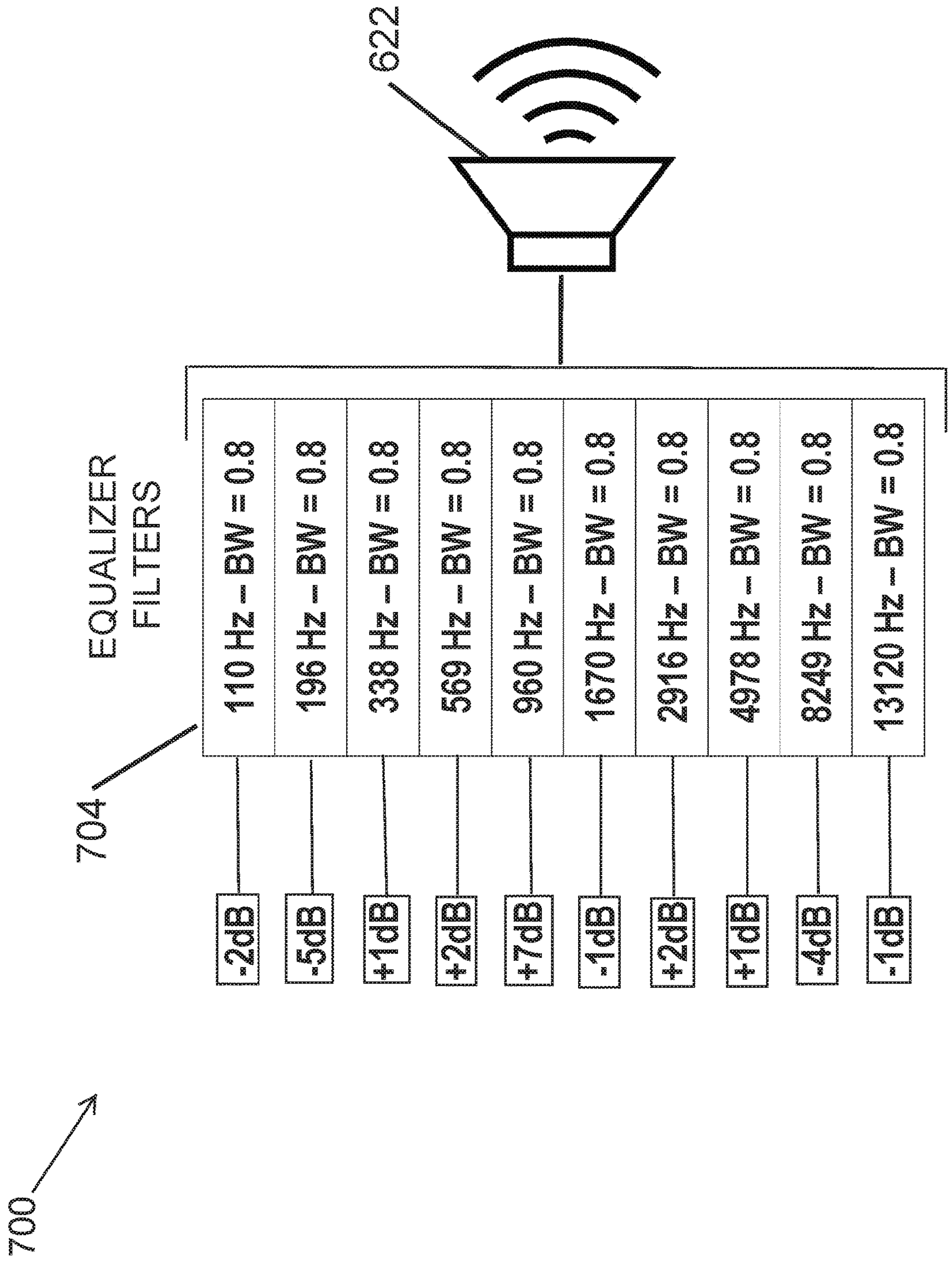

Turning now to FIGS. 4 and 5, the Auto Equalization function of the inventive system will be described. The Auto Equalization function, designated generally in FIG. 4 by the reference number 700, works by means of comparison. It will listen to the target speaker 622 playing pink noise through a set of bandpass filters 702 (FIG. 4A). The number of bandpass filters should be the same as the number of equalizer bands 704 (FIG. 4B) available.

This number will vary according to the power of the DSP platform. Powerful DSPs are capable of more equalizer bands (for example, 31 EQ bands), whereas less powerful DSPs are capable of less equalizer bands (for example, 10 EQ bands). This can be scaled accordingly, but the operation concept remains the same regardless of the number of filters.

The center frequency of the bandpass filters 702, as well as the bandwidth, also needs to match the values of Equalizer Bands 704. For example, for a 10 EQ-Band system, as shown in FIGS. 4A and 4B, with an effective range of 80 to 16 kHz, the center frequency and bandwidth (BW) for the EQ-Bands 704 and bandpass filters 702 are approximately as follows:

BW=0.8 octave

EQ Bands center freq: 110, 196, 338, 569, 960, 1670, 2916, 4978, 8249, 13120 Hz.

Once the ASP listens to the speaker 622 through these bandpass filters 702, it will sum the results of each bandpass filter and divide it by the total number of bandpass filters (10 in this example), thus, averaging the result. This average "response" number will be the 0.0 dB reference. Once the reference is set, the ASP will look at the results of each bandpass filter again, this time in relation to the 0.0 dB reference, and assign a value to it, such as +2 dB on filter 1, +5 dB on filter 2, −1 dB, and so on, as shown in FIG. 4A.

These values are then "negated," that is, multiplied by −1, as seen in FIG. 4B, and finally applied to the EQ Bands 704 as means to correct the uneven frequency response found. Hence, if the "listening" result at 8249 Hz was +4 dB, then −4 dB will be applied to the 8249 Hz EQ band. Therefore, the new "listening" value should be 0 dB, which is ideal (same as the 0 dB reference). By performing these operations, a flatter frequency response is obtained.

It will be apparent to those skilled in the art that various changes can be made in the exemplary systems and functions shown and described herein. By way of example, although the example shown and described shows the use of multiple bandpass filters, in some embodiments, a single bandpass filter will suffice. This is because the MCU and DSP can dynamically change the center frequency and bandwidth values of the single one bandpass filter during the sweep process, effectively accomplishing the same result, but using less DSP power.

The embodiments shown and described above are exemplary. Many details are often found in the art and, therefore, many such details are neither shown nor described herein. It is not claimed that all of the details, parts, elements, or steps described and shown herein are newly invented. Where one such component is shown and described, it will be noted that this can be replaced by multiple components providing the same overall functionality, and similarly where functionality is shown distributed between different blocks for ease of illustration, this functionality can be provided in a single component, all within the principles of the invention to the full extent indicated by the broad meaning of the terms in the attached claims. The description and drawings of the specific embodiments herein do not point out what an infringement of this patent would be, but rather provide non-limiting examples of how to use and make the invention. Likewise, the abstract is neither intended to define the invention, which is measured by the claims, nor is it intended to be limiting as to the scope of the invention in any way. The limits of the invention and the bounds of the patent protection are measured by and defined in the following claims.

What is claimed is:

1. An automated tuning system for a vehicle sound system, wherein the sound system comprises a head unit capable of outputting an audio signal, an amplifier, a plurality of speakers including rear speakers, and a control comprising a bi-amplification switch movable between on and off positions, the system comprising:

a digital signal processor (DSP) having an input for a microphone; and an external microphone connectable to the microphone input of the digital signal processor;

wherein the DSP is further configured to apply time arrival correction to at least a first one of the plurality of speakers based on the relative distances between the first one of the plurality of speakers and the microphone and at least a second one of the plurality of speakers and the microphone;

wherein the DSP is further configured to detect the presence of a tweeter as one of the plurality of speakers and to detect the position of the bi-amplification switch; and wherein the DSP is further configured, after the time arrival correction is applied and when a tweeter is not present and the bi-amplification switch is off, to perform the following processes: conduct equalization on each of the plurality of speakers; and apply brightness correction on the rear speakers.

2. The automated tuning system of claim 1 wherein the DSP is configured to detect the presence of a tweeter by performing a frequency sweep.

3. An amplifier comprising the automated tuning system of claim 1.

4. A method for tuning a vehicle sound system comprising:

installing the automated tuning system of claim 1 in the vehicle;

manually positioning the microphone; and running the system.

5. An automated tuning system for a vehicle sound system, wherein the sound system comprises a head unit capable of outputting an audio signal, an amplifier, a plurality of speakers including mid-bass speakers, and a control comprising a bi-amplification switch movable between on and off positions, the system comprising:

a digital signal processor (DSP) having an input for a microphone; and an external microphone connectable to the microphone input of the digital signal processor;

wherein the DSP is further configured to apply time arrival correction to at least a first one of the plurality of speakers based on the relative distances between the first one of the plurality of speakers and the microphone and at least a second one of the plurality of speakers and the microphone;

wherein the DSP is further configured to detect the presence of a tweeter as one of the plurality of speakers and to detect the position of the bi-amplification switch; and wherein the DSP is further configured, after the time arrival correction is applied and when a tweeter is present and the bi-amplification switch is on, to perform the following processes: a crossover application to apply the high pass filter to the tweeter and to apply the low pass filter to the mid-bass speakers; conduct sensitivity matching for all of the plurality of speakers; apply gain balance to the speakers; and conduct equalization on each of the plurality of speakers.

6. The automated tuning system of claim 5 wherein the DSP is configured to detect the presence of a tweeter by performing a frequency sweep.

7. An amplifier comprising the automated tuning system of claim 5.

8. A method for tuning a vehicle sound system comprising:

installing the automated tuning system of claim 5 in the vehicle;

manually positioning the microphone; and running the system.

9. An automated tuning system for a vehicle sound system, wherein the sound system comprises a head unit capable of outputting an audio signal, an amplifier, a plurality of speakers including mid-bass speakers and dash speakers, and a control comprising a bi-amplification switch movable between on and off positions, the system comprising:

a digital signal processor (DSP) having an input for a microphone; and an external microphone connectable to the microphone input of the digital signal processor;

wherein the DSP is further configured to apply time arrival correction to at least a first one of the plurality of speakers based on the relative distances between the first one of the plurality of speakers and the microphone and at least a second one of the plurality of speakers and the microphone;

wherein the DSP is further configured to detect the presence of a tweeter as one of the plurality of speakers and to detect the position of the bi-amplification switch; and wherein the DSP is further configured, after the time arrival correction is applied and when no tweeter is present and the bi-amplification switch is on, to perform the following processes: a crossover application to apply the high pass filter to the tweeter and to apply the low pass filter to the mid-bass speakers; conduct sensitivity matching for all of the plurality of speakers; apply gain balance to the speakers; and, conduct equalization on each of the plurality of speakers.

10. The automated tuning system of claim 9 wherein the DSP is configured to detect the presence of a tweeter by performing a frequency sweep.

11. An amplifier comprising the automated tuning system of claim 9.

12. A method for tuning a vehicle sound system comprising:

installing the automated tuning system of claim 9 in the vehicle;

manually positioning the microphone; and running the system.

13. An automated tuning system for a vehicle sound system, wherein the sound system comprises a head unit capable of outputting an audio signal, an amplifier, a plurality of speakers, and a control comprising a bi-amplification switch movable between on and off positions, the system comprising:

a digital signal processor (DSP) having an input for a microphone; and an external microphone connectable to the microphone input of the digital signal processor; and a timer;

wherein the DSP is further configured to apply time arrival correction to at least a first one of the plurality of speakers based on the relative distances between the first one of the plurality of speakers and the microphone and at least a second one of the plurality of speakers and the microphone;

wherein the DSP is further configured to detect the presence of a tweeter as one of the plurality of speakers and to detect the position of the bi-amplification switch;

wherein the DSP further comprises a time delay measurement circuit comprising:

a tone generator circuit to output a signal reproducible by the speakers;

a signal-out detector circuit configured to output a signal to a selected one of the plurality of speakers and simultaneously to output a signal to the timer to activate the timer;

a trigger switch responsive to a control input and connected to receive the signal output by the tone generator, to output the signal to the selected speaker;

a bandpass filter connected to receive an audio signal from the microphone; and a signal-in detector circuit connected to receive input from the bandpass filter and configured to output a signal to the timer to stop the timer in response to input from the bandpass filter.

14. The automated tuning system of claim 13 wherein the DSP is configured to detect the presence of a tweeter by performing a frequency sweep.

15. An amplifier comprising the automated tuning system of claim 13.

16. A method for tuning a vehicle sound system comprising:

installing the automated tuning system of claim 13 in the vehicle;

manually positioning the microphone; and running the system.

17. An automated tuning system for a vehicle sound system, wherein the sound system comprises a head unit capable of outputting an audio signal, an amplifier, a plurality of speakers, and a control comprising a bi-amplification switch movable between on and off positions, the system comprising:

a digital signal processor (DSP) having an input for a microphone;

an external microphone connectable to the microphone input of the digital signal processor; and an auto equalizer circuit comprising:

a bandpass filter array comprising a selected number of bandpass filters, the array of filters configured to receive an audio signal output from the microphone in response to pink noise emitted from a selected one of the plurality of speakers;

an equalizer filter array comprising a selected number of equalizer filters equal to the selected number of bandpass filters and configured to output an audio signal to the selected one of the plurality of speakers;

an equalizer circuit configured to receive the audio signal outputs from each filter in the bandpass filter array, to compute an average value of the signal output from all of the bandpass filters, to compare the output of each bandpass filter to the average value to generate a reference value, to generate a negated value for each reference value, and to output the negated values to the equalizer filter array; and wherein the DSP is further configured to apply time arrival correction to at least a first one of the plurality of speakers based on the relative distances between the first one of the plurality of speakers and the microphone and at least a second one of the plurality of speakers and the microphone.

18. The automated tuning system of claim 17 wherein the DSP is further configured to detect the presence of a tweeter as one of the plurality of speakers and to detect the position of the bi-amplification switch.

19. The automated tuning system of claim 17 wherein the DSP is configured to detect the presence of a tweeter by performing a frequency sweep.

20. An amplifier comprising the automated tuning system of claim 17.

21. A method for tuning a vehicle sound system comprising:

installing the automated tuning system of claim 17 in the vehicle;

manually positioning the microphone; and running the system.

* * * * *